(12) United States Patent
Li

(10) Patent No.: US 6,266,144 B1
(45) Date of Patent: Jul. 24, 2001

(54) STEPPER AND SCANNER NEW EXPOSURE SEQUENCE WITH INTRA-FIELD CORRECTION

(75) Inventor: Meng Chun Li, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/383,598

(22) Filed: Aug. 26, 1999

(51) Int. Cl.⁷ .................................................. G01B 11/00
(52) U.S. Cl. ...................... 356/401; 356/363; 356/23.01; 356/237.2
(58) Field of Search ............................... 356/363, 237.1, 356/237.2, 237.4, 237.5, 401

(56) References Cited

U.S. PATENT DOCUMENTS

| | | | |
|---|---|---|---|
| Re. 33,836 | 3/1992 | Resor, III et al. ................. 355/43 |
| 4,347,011 | * 8/1982 | Levy et al. ......................... 356/398 |
| 4,823,012 | 4/1989 | Kosugi ............................... 250/491.1 |
| 4,982,227 | 1/1991 | Suzuki ............................... 355/53 |
| 5,438,413 | * 8/1995 | Mazor et al. ...................... 356/363 |
| 5,444,538 | 8/1995 | Pellegrini .......................... 356/401 |
| 5,633,505 | 5/1997 | Chung et al. ..................... 250/491.1 |
| 5,655,110 | 8/1997 | Krivokapic et al. ............. 395/500 |
| 5,841,144 | 11/1998 | Cresswell ......................... 250/491.1 |
| 5,879,866 | 3/1999 | Starikov et al. ................. 430/395 |

OTHER PUBLICATIONS

Morita et al., "Impacts of Reticle and Wafer Elasticity Control on Overall Alignment Management Strategy", SPIE vol. 3334, pp. 510–518, 0277–786x/98.

* cited by examiner

*Primary Examiner*—Frank G. Font
*Assistant Examiner*—Roy M. Punnoose
(74) *Attorney, Agent, or Firm*—George O. Saile; Stephen B. Ackerman; Graham S. Jones, II

(57) ABSTRACT

A method and system are provided for determining the degree of overlay misregistration when exposing a semiconductor wafer having a center and a periphery comprises the following steps. Expose the wafer with a scan in a sequence from the center of the wafer to the periphery. Select dies on the periphery of a wafer for measurement which represent a maximum degree of distortion, and employ a correction algorithm for calculating an intrafield reduction ratio to minimize heat expansion.

15 Claims, 9 Drawing Sheets

STEPPER AND SCANNER NEW EXPOSURE SEQUENCE WITH INTRA-FIELD CORRECTION

BACKGROUND OF THE INVENTION

1. Field of the Invention

This invention relates to stepper exposure systems and more particularly to correction methods and apparatus therefor.

2. Description of Related Art

U.S. Pat. No. 4,823,012 of Kosugi for "Step and Repeat Exposure Apparatus Having Improved System for Aligning" describes alignment marks provided in association with neighboring fields on a wafer which are to be exposed to a reticle pattern in sequence.

U.S. Pat. No. 4,982,227 of Suzuki for "Photolithographic Exposure Apparatus with Multiple Alignment Modes" shows a method for alignment using multiple alignment modes by adapting an alignment method by a sample alignment prior to the exposure operation. The alignment modes examine multiple sized fields.

U.S. Pat. Re. 33,836 of Resor, et al. for "Apparatus and Method for Making Large Area Electronic Devices, Such as Flat Panel Displays and the Like, Using Correlated, Aligned Dual Optical Systems" shows an alignment method for substrates (displays not chips) that includes a means for aligning images.

U.S. Pat. No. 5,444,538 of Pellegrini for "System and Method for Optimizing the Grid and Intrafield Registration of Wafer Patterns" describes measurement of overlay misregistration and a method for optimizing the (grid) interfield and intrafield registration of dies.

U.S. Pat. No. 5,655,110 of Krivokapic et al. for "Method for Setting and Adjusting Process Parameters to Maintain Critical Dimensions across each Die of Mass-Produced Semiconductor Wafers" teaches a method for adjusting alignment parameters to optimize the photo process.

U.S. Pat. No. 5,633,505 of Chung et al., commonly assigned, for "Semiconductor Wafer Incorporating Marks for Inspecting First Layer Overlay Shift in Global Alignment Process" relates to overlay inspection.

See the Morita et al. reference "Impacts of Reticle and Wafer Elasticity Control on Overall Alignment Management Strategy", SPIE Vol. 3334, pp 510–518, 0277–786X/98.

U.S. Pat. No. 5,841,144 of Cresswell for "Overlay Target and Measurement Procedure to Enable Self-Correction for Wafer-Induced Tool-Induced Shift by Imaging Sensor Means" discusses in the abstract "test structure elements . . . with one component of each spaced at progressively greater distances from an arbitrary baseline, such that a zero overlay element may be identified by the alternative imaging senor means".

U.S. Pat. No. 5,879,866 of Starikov et al. for "Image Recording Process with Improved Image Tolerances Using Embedded AR Coatings" discusses self-correction of overlay using antireflective materials.

In the current state of the art, the optical stepper exposure sequence depends only on the level at which the sensor can work on the dies to be exposed or can not work on the dies because of distortion problems related to expansion generated by heating of elements of the system which leads to misalignment. Thus there a is need to solve this distortion problem.

SUMMARY OF THE INVENTION

Heretofore, exposure systems have not considered intra-field distortion insofar as it relates to the exposure sequence. For that reason, with the current state of the art, the impact of the sequence of exposure as related to correction analysis of misalignment of overlay can not be optimized, especially on an intra-field basis. In the past, no algorithm has been provided for analyzing intra-field errors caused by the exposure sequence employed by the exposure system.

A principal purpose of this invention is to achieve maximum efficiency during exposure of a wafer by a stepper through a reticle by reducing the impact of thermal distortion problems during exposure.

Features of this invention include as follows:

1. The exposure sequence from the center of the wafer through the same radius array sequence provides better control of the degree of overlay misregistration.
2. Measurement of the degree of overlay misregistration should pick dies on the edge of a wafer which can represent a maximum degree of distortion. Through this exposure sequence, optimization of the overlay registration can be achieved by minimizing the degree of misregistration.
3. According to this exposure sequence, steppers and scanners facilitate the design of an algorithm for calculating the intrafield reduction ratio to minimize heat expansion.

This invention provides an exposure sequence which permits overlay measurement with a better model for analyzing wafer overlay correction.

The resultant heat expansion correction algorithm employs this exposure sequence to minimize intrafield error.

A method and system are provided for determining the degree of over-lay misregistration when exposing a semiconductor wafer having a center and a periphery as follows. Expose the wafer with a scan in a sequence from the center of the wafer to the periphery. Select dies on the periphery of a wafer for measurement which represent a maximum degree of distortion, and employ a correction algorithm for calculating an intrafield reduction ratio to minimize heat expansion.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
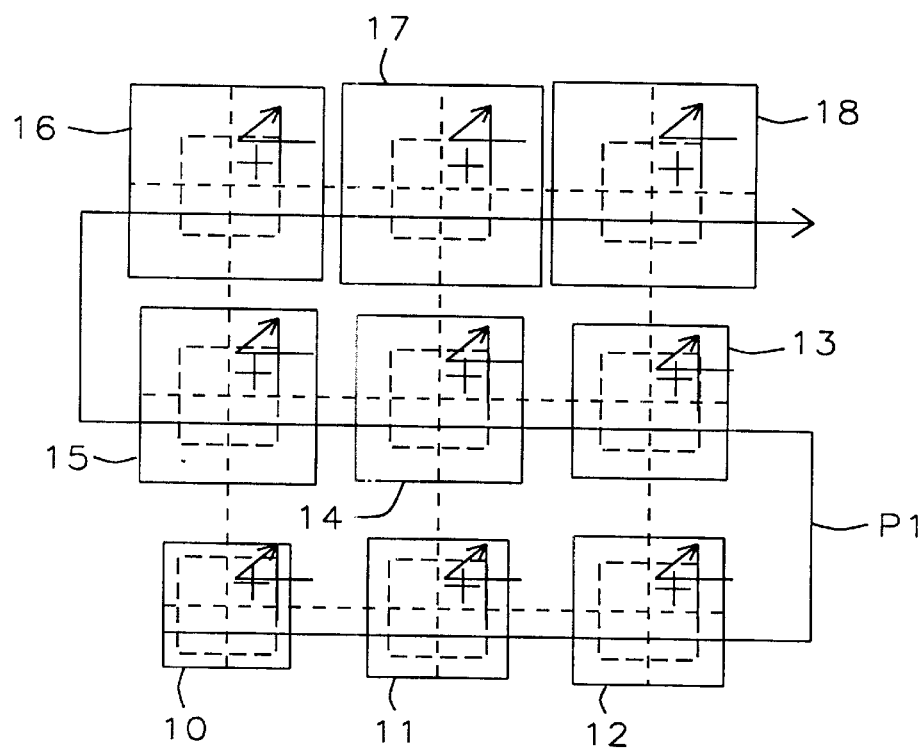
FIG. 1 shows how shot expansion in the first print causes both magnification and base-line errors as the scan path starts with one die and then proceeds to the right across dies increasing the exposure square in area with each exposure.

Stepper alignment factors contribute to distortion at dimensions on the order of 10 nm. In FIG. 1, shot expansion in the first print causes both magnification and base-line errors as the scan path P1 starts with die 10, proceeds to the right across dies 11 and 12 increasing the exposure square in area with each exposure. Then the path P1 goes up above die 12 to die 13 and from right to left to dies 14 and 15 which also are ever larger in area. Next, the path P1 goes up above die 15 to die 16 and from left to right to dies 17 and 18 which also are ever larger in area, with die 18 being approximately double the area of die 10 in the illustration.

Figure 2:
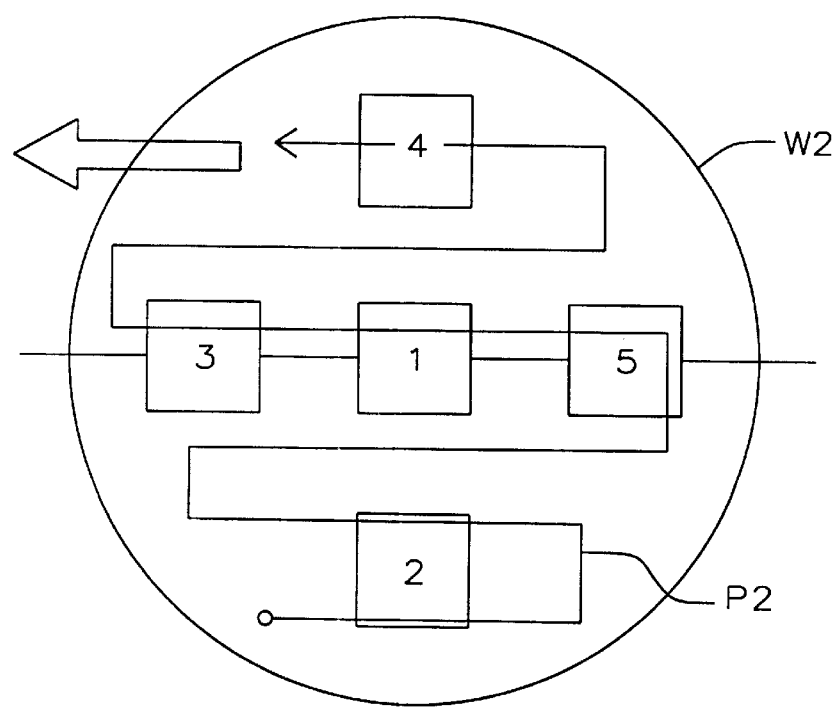
FIG. 2 shows a wafer with square dies and a scanning pattern employed during exposure with a boustrophedonic (as in oxen plowing) type of scan.

FIG. 2 shows a wafer with square dies and a scanning pattern employed during exposure with a boustrophedonic (as in oxen plowing) type of scan. Heat expansion introduces intra-field distortion randomly, e.g. field 4 in FIG. 2. In FIG. 2, a wafer W2 is shown with square dies 1–5. Die 1 in located in the center, die 2 on the bottom below die 1, die 3 to the left of die 1, die 5 to the right of die 1, and die 4 is located above die 1. The scan P2 first traces across the bottom edge of square die 2, and scan P2 turns up and retraces a path parallel to the first trace along the top edge of die 2. Then scan P2 turns up and traces a path above and parallel to the first and second traces. Then when scan P2 reaches the right edge of die 5, scan P2 turns up and traces along the right edge of die 5 and turns to trace along the top edge of wafers 5, 1 and 3 in that order. Then scan P2 turns up and traces up to scan to the right between wafer 1 and wafer 4 and after passing wafer 4, scan P2 turns up and traces up until it is aligned with the center of die 4; whereupon it turns left and scans through the center of die 4 where upon scan P2 has completed its path. This type of scan tends to have the problems described with the scanning sequence of FIG. 1. A measurement sequence follows from die 1 to die 2 to die 3 to die 4 to die 5.

Figure 3:
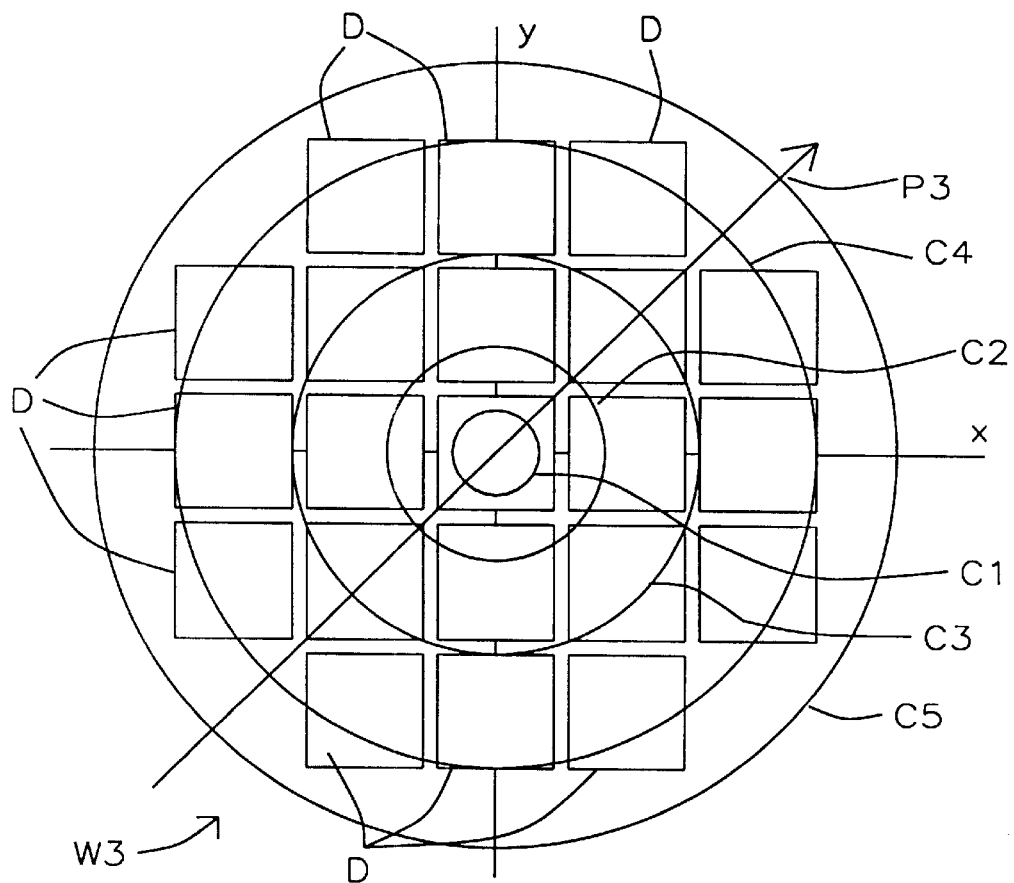
FIG. 3 shows an exposure sequence in accordance with this invention moving from the origin in the center of a wafer to the edge thereof along a path.

FIG. 3 shows an exposure sequence in accordance with this invention moving radially from the origin in the center of wafer W3 to the edge thereof along path P3. There are twenty-one dies D arranged in five rows and five columns with five concentric circles C1, C2, C3, C4 and C5 and with the path P3 at a 45° angle in the first quadrant of the X, Y coordinates moving from the origin to the periphery of the wafer W3. This function shows the radius relationship of the structure being exposed.

Figure 4A:
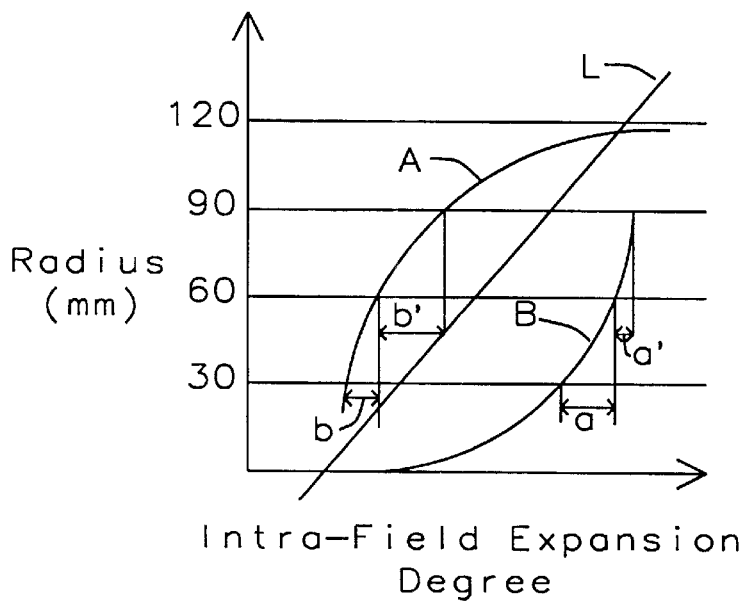
FIG. 4A shows a chart of radius vs. intra-field expansion with a line L and a pair of curves A and B.

FIG. 4A shows how the exposure sequence of FIG. 3 permits use of a the radius of the wafers vs. the intra-field expansion degree. This is for an eight inch (8") wafer with a 200 mm diameter with a radius of about 100 mm. In FIG. 4A there is a line L with a pair of curves A and B. Line L shows a linear curve of constant expansion vs. wafer radius. Curve A shows that outer expansion is more serious than inner. Curve B shows that inner expansion is more serious than outer expansion. When a measurement of overlay is made we can find a vector which has this kind of change.

Referring to FIG. 4A, we set the radius to several values, for example 20 mm, 50 mm, 80 mm, and 100 mm. As can be seen, the degree of change for curve B, a>a' is obvious. For curves A, b>b' is also obvious. Thus the trend required for correction is revealed from the relationship between these degrees of change.

Algorithm

Figure 4B:
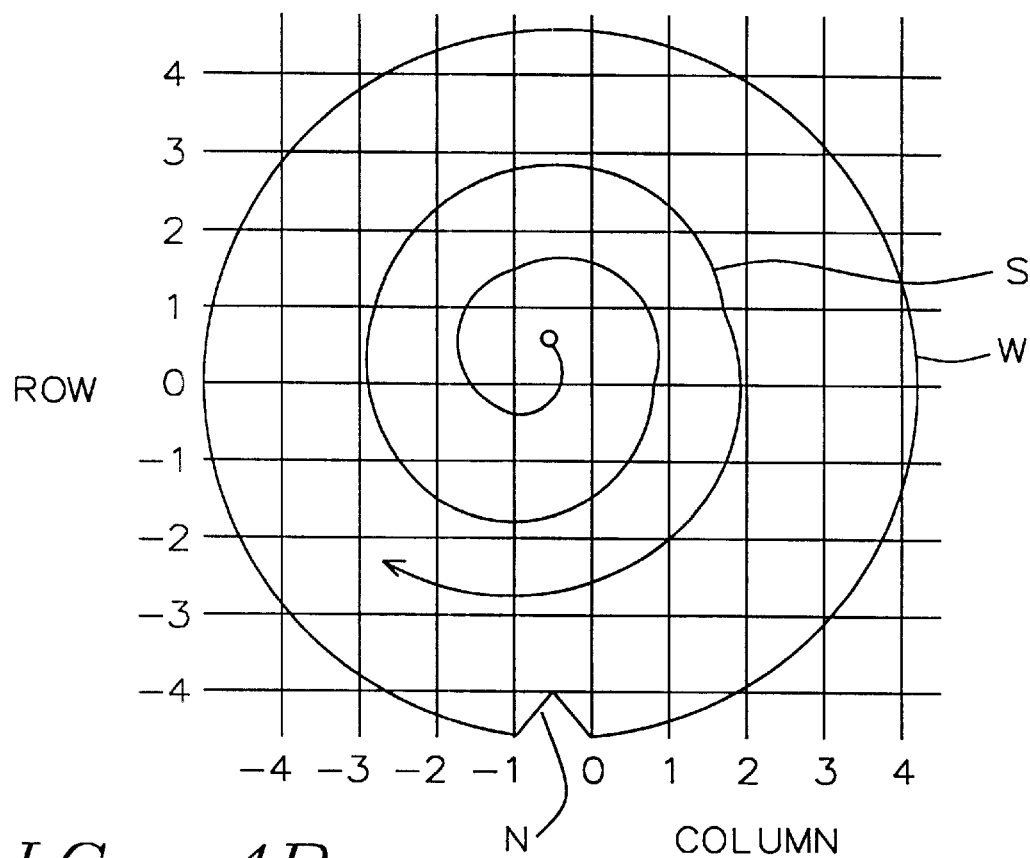
FIG. 4B shows a graph of a spiral scan of the wafer of FIG. 2 made in accordance with this invention.

FIG. 4B shows a graph of a spiral scan of the wafer of FIG. 2 made in accordance with this invention.

Figure 11:
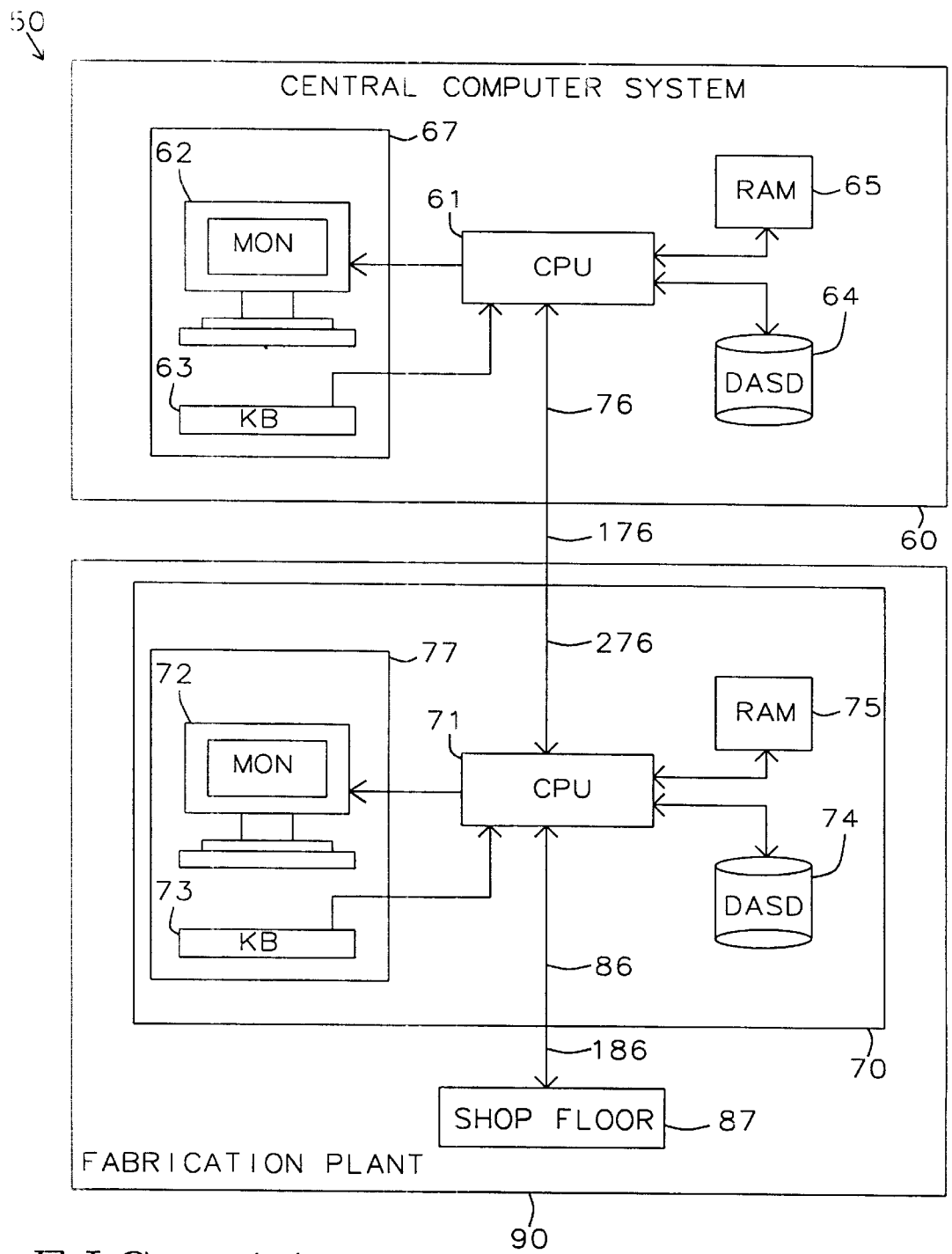
FIG. 11 shows a manufacturing plant which includes a central computer system and a fabrication plant with a shop floor where products, such as semiconductor chips, are being manufactured and a computer system for allocating the plant resources in accordance with this invention.

The algorithm of this invention advances in a spiral radial scan from the center of the wafer to expose each die. The stepper die location is within a certain radius range to give a compensation factor to correct error. Referring to FIG. 11, a grid is shown overlying a wafer W with an alignment notch N. The grid extends with horizontal rows from row –4 on the bottom to row 4 on the top and with vertical columns from column –4 on the left to column 4 on the right. A spiral clockwise scan starts in the geometric center of the wafer W extending at a column value of –1 to a row value of –0.5. up to above row 1.5 at column –0.5, etc. and continuing to about column –2.8 at about row –2.4. In this example, the wafer diameter is 203 mm, the field width is 20.460 mm, and the field height is 20.610 mm. See tables I and II below.

TABLE I

|  | X | | Y | |
| --- | --- | --- | --- | --- |
|  | Average | 3*sd | Average | 3*sd |
| Row | 17.4 | 123.8 | –21.3 | 144.1 |
| Residual | 0.4 | 24.2 | –0.4 | 24.2 |

3*sd is defined as three (3) times standard deviation (sd)
Residual is defined as the error remaining after correction which is uncorrectable.

TABLE II

|  | Field | | | Gried | |
| --- | --- | --- | --- | --- | --- |
|  | Trans (nm) | Mag (ppm) | Rot (urad) | Mag (ppm) | Rot (urad) |
| X | 9.5 | 2.7335 | –0.5658 | 0.9108 | –0.2579 |
| Y | –21.0 |  |  | 0.8303 | 0.0283 |

Gried — "Interfield": whole wafer effect
Mag — Magnification
Rot — Rotation

Figure 5:
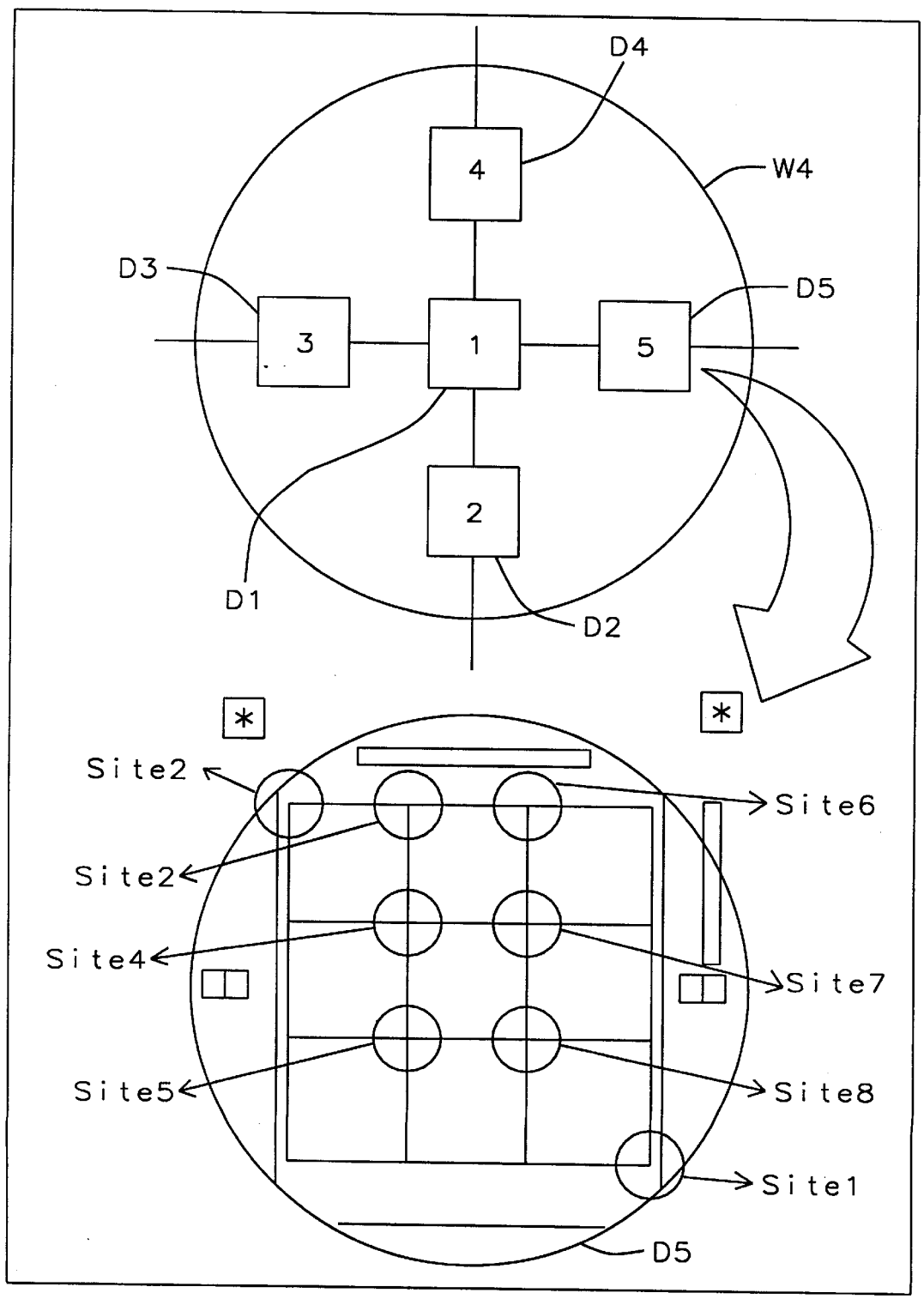
FIG. 5 shows a wafer with five dies, and one of which is shown in an exploded view with a large circle including eight sites to be inspected.

FIG. 5 shows a wafer W4 with dies D1 on origin centered over the X axis and the Y axis. Dies D4 and D2 are located on the Y axis equidistant from the origin respectively above and below the die D1. Dies D3 and D5 are located on the X axis equidistant from the origin respectively to the left and to the right of the die D1. Die D5 has been shown exploded into a large circle with sites Site1 to Site8.

Figure 6:
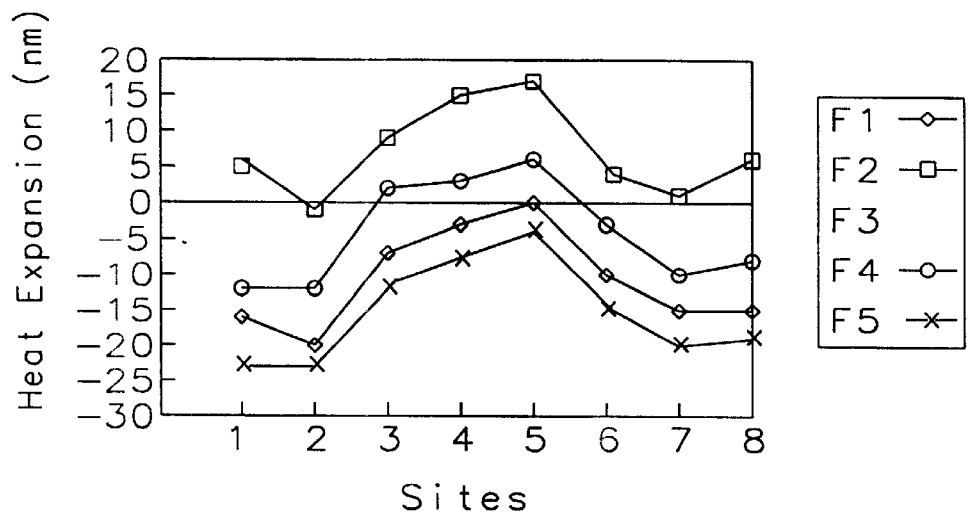
FIGS. 6 and 7 show curves of Heat Expansion vs Exposure Sequence for a selected die in FIG. 5 before correction.

FIG. 6 shows results of Heat Expansion vs. Exposure tests in the X direction for the eight sites Site1 to Site8 in FIG. 5 for F1, F2, F4 and F5. F1, F2, F4 and F5 are the fields which correspond to the sites of the four dies D1, D2, D4 and D5, i.e. field F1 is die D1.

Figure 7:
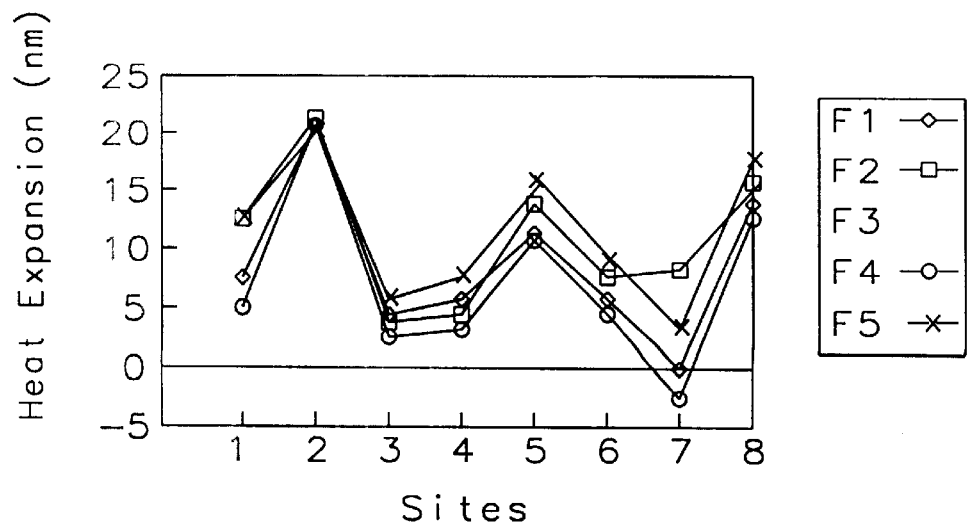

FIG. 7 shows results of Heat Expansion vs. Exposure tests for the eight sites Site1 to Site8 in FIG. 5 for F1, F2, F4 and F5, showing the data in the Y direction of overlay data. Again F1, F2, F4 and F5 are the fields which correspond to the sites of the four dies D1, D2, D4 and D5.

Figure 8:
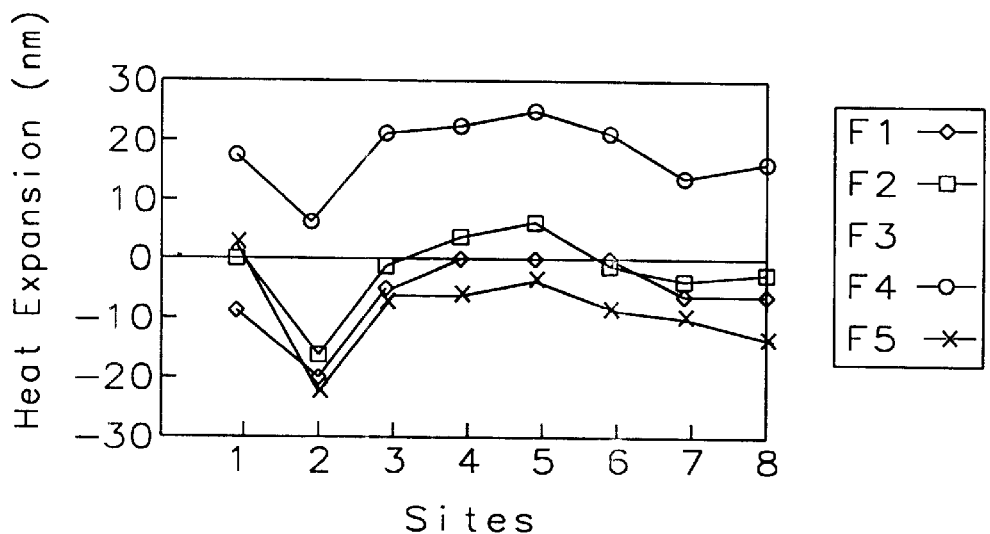
FIGS. 8 and 9 show curves of Heat Expansion vs Exposure Sequence for a selected die in FIG. 5 after correction.

FIG. 8 shows the results of Heat Expansion vs. Exposure tests for the eight sites Site1 to Site8 in FIG. 5 for F1, F2, F4 and F5 of the same materials as in FIG. 6 after correction test W1.

Figure 9:
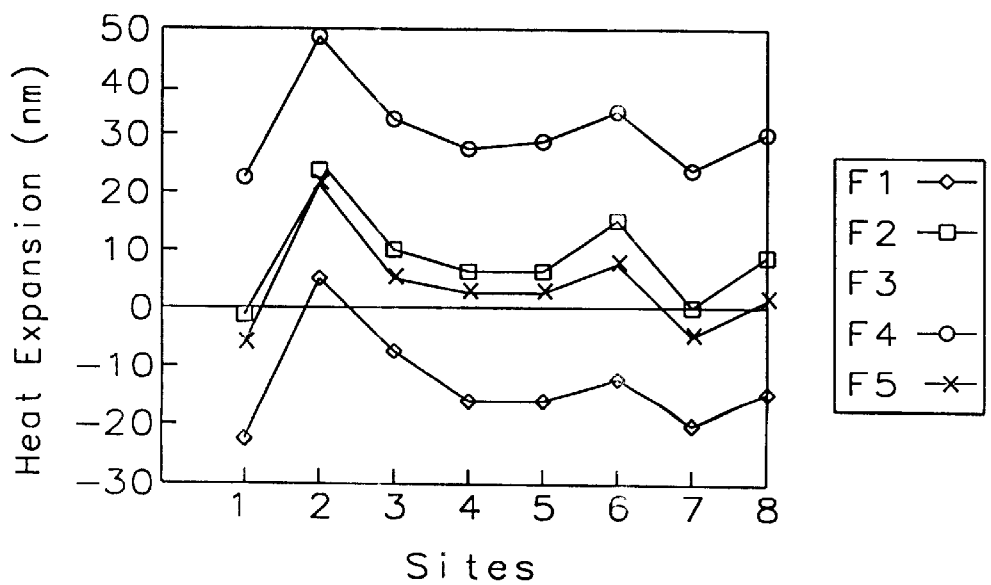

FIG. 9 shows the results of Heat Expansion vs. Exposure tests for the eight sites Site1 to Site8 in FIG. 5 for F1, F2, F4 and F5 of the same materials as in FIG. 7 after correction test W1.

The conclusion of review of FIGS. 6–9 is that the analysis software may converge in one direction but diverge the other direction owing to the exposure sequence and the measurement fields issue.

Figure 10:
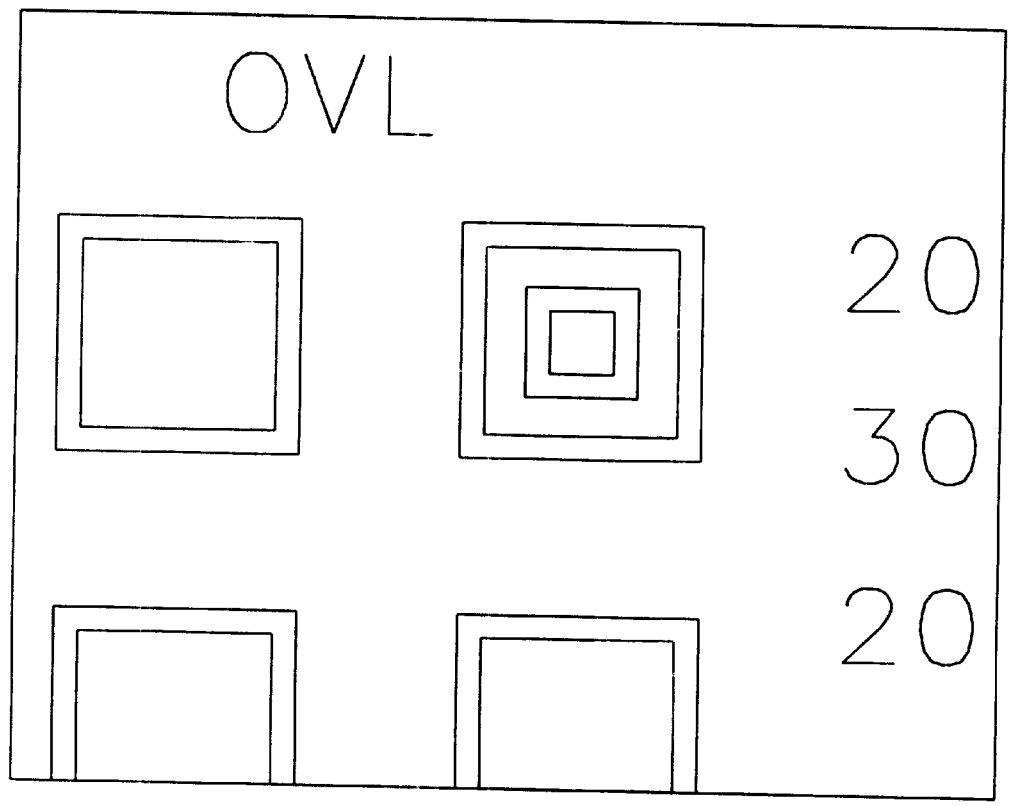
FIG. 10 shows a representation of a matrix of two partial squares and two whole squares formed by wide lines on the periphery of areas of a device. A smaller square is formed in the center of one of the squares. Indicia are also shown.

FIG. 10 shows a standard SEMI overlay target pattern with a representation of a matrix of two partial squares and two whole squares formed by wide lines on the periphery of areas of a device. A smaller square is formed in the center of one of the squares. In addition the indicia OVL, 20, 30 and 20 are shown in the drawing where 20 which are formed by the silicon nitride layer, and the number 30 is formed by the polysilicon 1 layer. This pattern is a target used to determine the overlay error.

FIG. 11 shows a manufacturing plant which includes a central computer system and a fabrication plant with a shop floor where products, such as semiconductor chips, are being manufactured and a computer system for allocating the plant resources in accordance with this invention.

System Configuration

FIG. 11 shows a manufacturing plant 50 which includes a central computer system 60 and a fabrication plant 90 with a shop floor 87 where products, such as semiconductor chips, are being manufactured and a computer system 70 for allocating fabrication plant resources in accordance with this invention.

The computer program in accordance with this invention is preferably resident in a site in the fabrication plant computer system 70 which is preferably connected, as shown in FIG. 11, as a part of the overall computer system with the central computer system 60, which is an alternative site for the computer program of this invention.

Referring again to FIG. 11, the computer system 70 operates as an integral part of the fabrication plant 90 and so it is shown located within the plant 90, but it may be located elsewhere, as will be obvious to those skilled in the art and it can be a portion of an overall consolidated system incorporating the central computer system 60 and can operate independently as a matter of choice.

The central computer system 60 shown in FIG. 11 comprises a CPU (Central Processing Unit) 61, a terminal 67 with a monitor 62 connected to the CPU 61 for receiving data from the CPU 61 and a keyboard 63 connected to the CPU 61 for sending data respectively to the CPU 61. A RAM (Random Access Memory) 65 and a DASD 64 associated with the CPU 61 are shown connected for bidirectional communication of data to and from CPU 61.

Lines 76, 176 and 276 provide for interconnections between the CPU 61 of system 60 to the CPU 71 of the fabrication plant computer system 70. Line 176 connects between lines 76 and 276 at the interfaces of computer 60 and a factory control computer system 70 respectively.

The factory control computer system 70 comprises a CPU 71, a terminal 77 with monitor 72 connected to the CPU 71 for receiving data respectively from the CPU 71 and keyboard 73 connected to the CPU 71 for sending data respectively to the CPU 71. A random access memory 75 and a DASD 74 associated with the CPU 71 are shown connected for bidirectional communication of data to and from CPU 71. Line 86 connects from CPU 71 to line 186 connects through the factory control computer 70 interface to the shop floor system 87. A layout viewer 78 is connected to the CPU 71 to display error flags generated by the pattern for used by the operator of the computer system 70.

The system 50 includes the data defining the scanning of the steppers for the plant 90 stored in one of the DASD unit 64, DASD unit 74 RAM 65 or RAM 75, as desired, in a conventional manner, as will be well understood by those skilled in the art.

Figure 12:
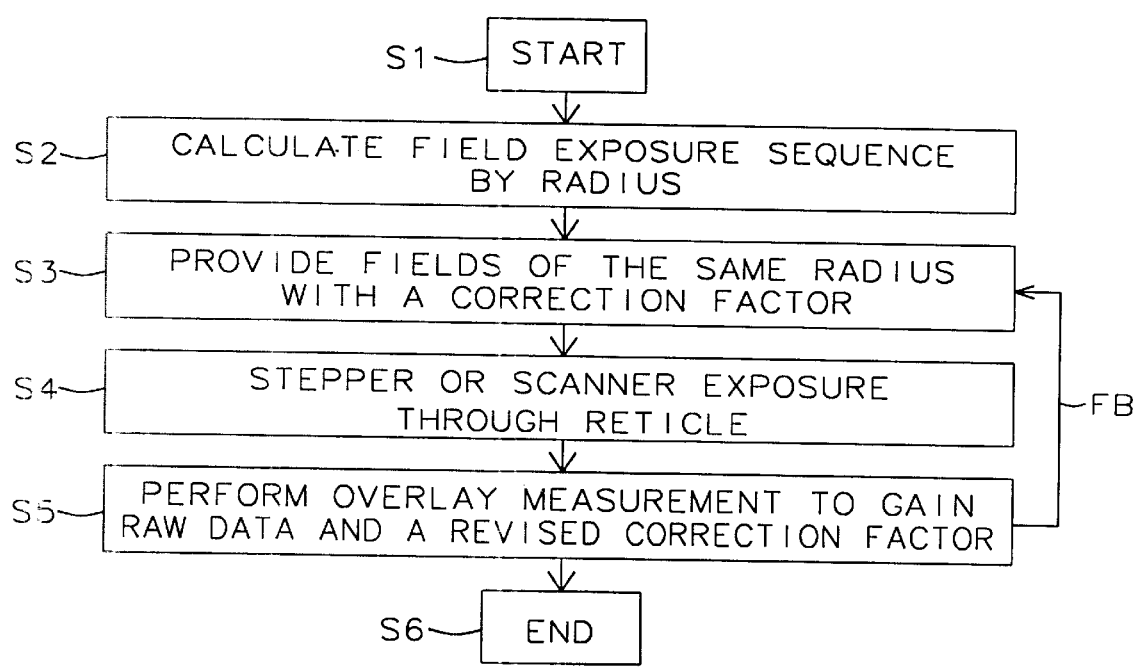
FIG. 12 shows a flow chart of a computer program in accordance with this invention.

FIG. 12 shows a flow chart of a computer program in accordance with this invention.

In step S1, the computer system of FIG. 11 starts the program of FIG. 12.

In step S2, the computer system of FIG. 11 calculates the field exposure sequence by radius.

In step S3, the computer system of FIG. 11 fields of the same radius receive the same correction.

In step S4, the computer system of FIG. 11 causes the stepper or scanner to expose.

In step S5, the computer system of FIG. 11 performs an overlay measurement to gain raw data and to provide a correction factor which is fed back on line FB to step S3.

In step S6 the computer system of FIG. 11 ends the program of FIG. 12.

Additional details of the algorithm of FIG. 12 are as follows:

1. According to the stepper job, the field layout map has already been produced independently for use during manufacturing.
2. Based upon the map, the program will automatically calculate the field exposure sequence such as a spiral line.
3. Based upon the overlay metrology tool measurement result, feedback from step S5 is employed to find the curve trend of lines A and B.
4. Add those different interfield correction factors to the fields of the same radius; then follow the spiral sequence to perform the exposure in step S4.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of determining the degree of overlay misregistration when using a reticle to expose a semiconductor wafer having a center and a periphery comprises the steps as follows:
    (a) calculate a field exposure sequence by radius,
    (b) provide fields of the same radius with a correction factor,
    (c) cause exposure through the reticle,
    (d) perform overlay measurement to gain raw data and a revised correction factor, and
    (e) feed back the revised correction factor to step (b).

2. A method of determining the degree of overlay misregistration when exposing a semiconductor wafer having a center and a periphery comprising:
    exposing the wafer with a scan in a sequence from the center of the wafer to the periphery including selection of dies on the periphery of a wafer for measurement which represent a maximum degree of distortion, and employing a correction algorithm for calculating an intrafield reduction ratio to minimize heat expansion.

3. A method in accordance with claim 2 including scanning in a radial direction.

4. A method in accordance with claim 2 including scanning outwardly along a spiraling path.

5. A method in accordance with claim 1 including scanning in a radial direction.

6. A method in accordance with claim 1 including scanning outwardly along a spiraling path.

7. A system for determining the degree of overlay misregistration when exposing a semiconductor wafer having a center and a periphery comprises means for exposing the wafer with a scan in a sequence from the center of the wafer to the periphery including:

(a) calculation means for calculating a field exposure sequence by radius, (b) correction means for providing fields of the same radius with a correction factor, (c) exposure means for causing exposure through the reticle, (d) measurement means for performing overlay measurement to gain raw data and a revised correction factor, and (e) feedback means for feeding back the revised correction factor to the correction means.

8. A system in accordance with claim 5 including means for selection of dies on the periphery of a wafer for measurement which represent a maximum degree of distortion.

9. A system in accordance with claim 7 including means for employing a correction algorithm for calculating an intrafield reduction ratio to minimize heat expansion.

10. A system in accordance with claim 9 including means for scanning in a radial direction.

11. A system in accordance with claim 9 including means for scanning outwardly along a spiraling path.

12. A system in accordance with claim 7 including:

means for selection of dies on the periphery of a wafer for measurement which represent a maximum degree of distortion, and means for employing a correction algorithm for calculating an intrafield reduction ratio to minimize heat expansion.

13. The system of claim 7 including:

means for selecting dies on the periphery of a wafer for measurement which represent a maximum degree of distortion, and means for employing a correction algorithm for calculating an intrafield reduction ratio to minimize heat expansion.

14. A system in accordance with claim 13 including means for scanning in a radial direction.

15. A system in accordance with claim 13 including means for scanning outwardly along a spiraling path.

* * * * *